(12) United States Patent
Alexander et al.

(10) Patent No.: US 6,369,742 B1
(45) Date of Patent: Apr. 9, 2002

(54) SELECTIVE OVER-RANGING IN FOLDING AND AVERAGING INTEGRATED CIRCUITS

(75) Inventors: Daniel D. Alexander, Gilbert; Syed Amir Aftab, Phoenix, both of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/704,025

(22) Filed: Nov. 1, 2000

(51) Int. Cl.[7] .................................................. H03M 1/36
(52) U.S. Cl. ........................................ 341/159; 341/155
(58) Field of Search ................................ 341/155, 156, 341/157, 159

(56) References Cited

U.S. PATENT DOCUMENTS 5,157,397 A * 10/1992 Vernon ........................ 341/157
5,471,210 A * 11/1995 Wingender et al. ......... 341/156
5,835,047 A * 11/1998 Vorenkamp et al. ........ 341/156
5,835,048 A    11/1998 Bult ............................ 341/159

* cited by examiner

*Primary Examiner*—Peguy JeanPierre
(74) *Attorney, Agent, or Firm*—Mark J. Fink

(57) ABSTRACT

A device and technique for selective over-ranging provides for the folding of signals in an input signal range such that the folded signals in the center of the input signal range are folded $N_F$ times while the folded signals at the lower and upper extremes of the input signal range are folded $NF_r+1$ times. One embodiment includes an over-ranging lower pre-amplifier group (230), a center pre-amplifier group (240) and an over-ranging upper pre-amplifier group (250).

21 Claims, 3 Drawing Sheets

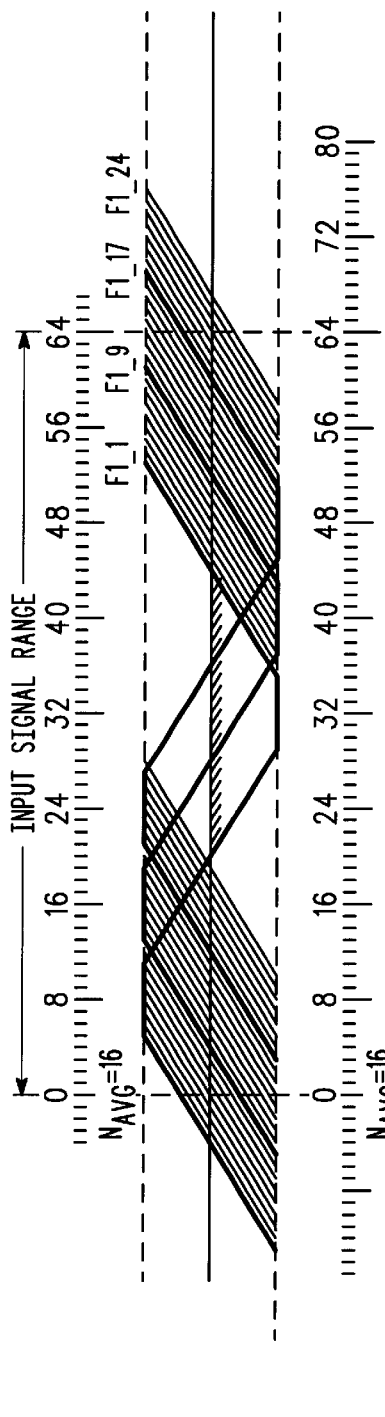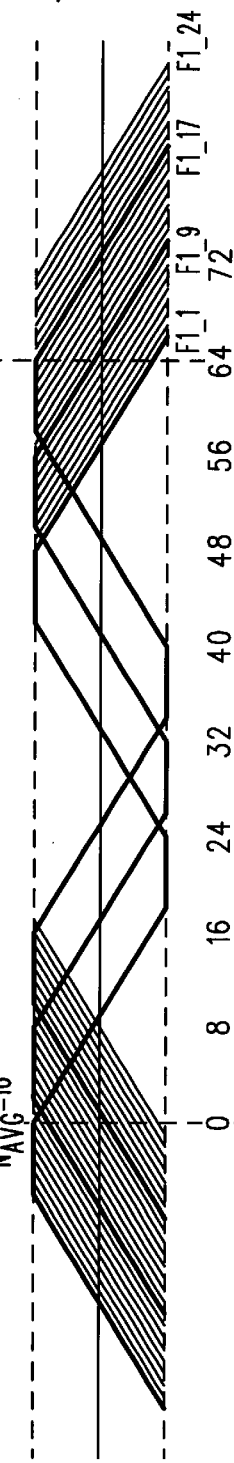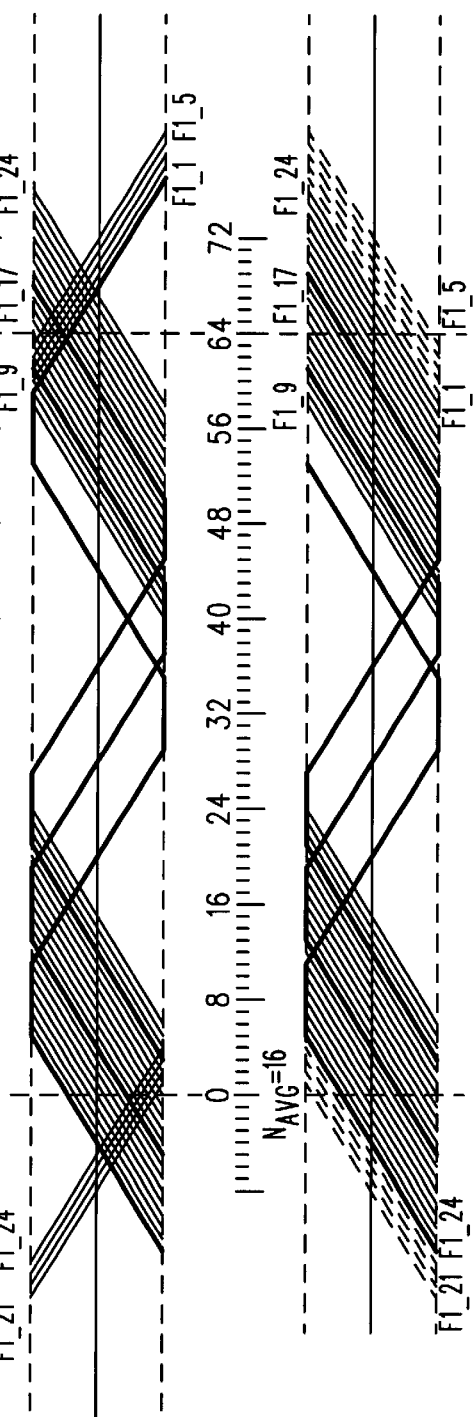

US 6,369,742 B1

SELECTIVE OVER-RANGING IN FOLDING AND AVERAGING INTEGRATED CIRCUITS

This invention is related, in general, to signal conversion and signal processing and the use of integrated circuits to perform these functions. More specifically, this invention provides a circuit and method using averaging, folding and interpolating for converting analog data to digital data.

It is common that converters provide conversion of analog signals to binary bits, providing N-bit accuracy. Typically this requires $2^N$ pre-amps and comparators, making the analog-to-digital integrated circuit complex. Integrated circuit implementations of analog-to-digital converters face the design trade off of increased resolution versus minimizing the cost and complexity overhead.

One method of reducing the number of comparators is known as folding. Signal folding involves combining the differential outputs of several pre-amplifiers at a common comparator. In three times folding, three differential pre-amplifiers drive each comparator. Classical folding begins with the generation of a folded version of an input signal and then quantizing that folded signal. However, this simplified approach results in distortion at the bends, i.e., locations where the folded signal has zero slope and then reverses slope. Each folded signal is slightly offset from the adjacent folded signals such that the bend in the fold is not used. The family of folded signals is interpolated to effectively increase the quantity of input signals and enhance the accuracy of the converter.

Another limitation of the prior art is cell mismatch. Cell mismatch occurs when successive pairs of differential pre-amplifiers have amplification differences. Individual mismatches between pre-amplifiers result in errors known as Differential Non-Linearity (DNL). The accumulation of DNL mismatch error is known as Integral Non-Linearity (INL).

A process referred to as averaging purports to solve the errors associated with DNL and INL. Averaging takes into account a group of folded signals above and below the zero crossing. This technique requires the incorporation of current sources and impedance strips, i.e., resistor strips, coupled to the outputs of the pre-amplifier cells. This architecture intends to "average out" cell mismatches by adding folds in the pre-amplifier circuits, an inefficient and costly solution.

By now it should be appreciated that a cost-effective solution to the problem of averaging differential and integral non-linearity at the upper and lower extremes of the input signal range is needed.

BRIEF DESCRIPTION OF THE DRAWINGS

FIG. 2 is a folded signal diagram without the folded signals at the lower and upper extremes of the input signal range;

FIG. 3 is a folded signal diagram that illustrates non-selective over-ranging by adding an extra fold to each of the folded signals in the family;

FIG. 4 is a folded signal diagram that illustrates one embodiment of the selective over-ranging technique of the current invention;

FIG. 5 is a folded signal diagram illustrating reverse polarity of the selective over-ranging folded signals;

DETAILED DESCRIPTION OF THE DRAWINGS

A folded signal is created from an input signal within a specified input signal range by a pre-amplifier circuit comprised of a plurality of transconductance amplifiers. An $N_F$ times folded signal, i.e., an input signal folded $N_F$ times, will require $N_A$ number of transconductance amplifiers, where the integer number $N_A$ equals the integer number $N_F$.

The embodiment described below illustrates three times folding. However, it should be noted that the input signal may be folded any number of times depending on the application. The various techniques corresponding to the present invention are independent of the number of folds used in the application.

Figure 1A:
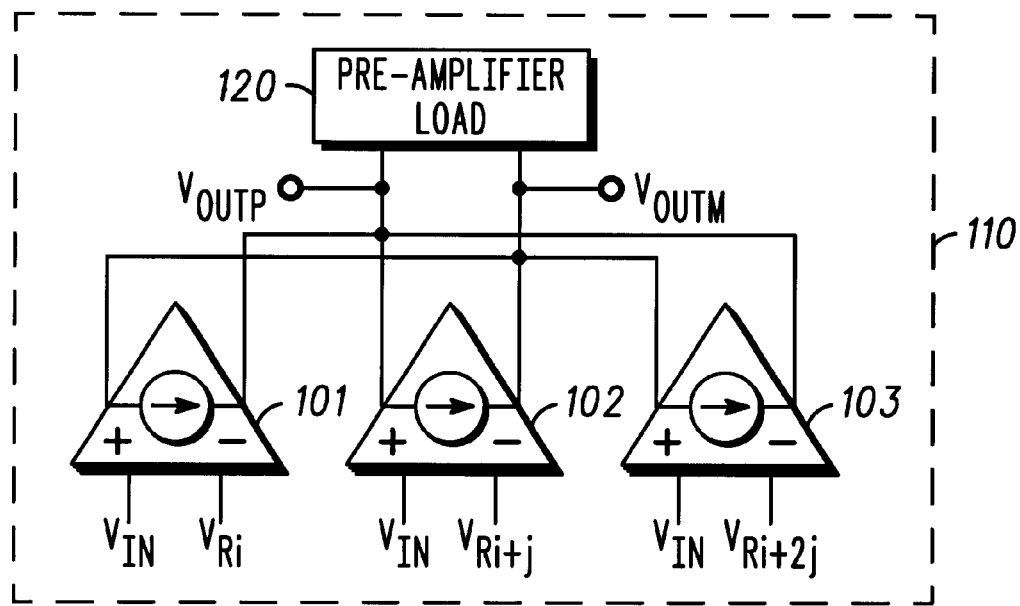
FIG. 1A is a partial circuit diagram of a folded pre-amplifier.

In FIG. 1A, a pre-amplifier circuit 110 comprised of a plurality of transconductance amplifiers 101, 102, and 103 and a pre-amplifier load 120 produces a folded signal. One input of each of the transconductance amplifiers 101–103 receives the input signal $V_{IN}$, while the other input of the amplifier is connected to a reference voltage $V_R$. The reference voltage $V_R$ is typically provided from a resistor ladder tap. More specifically, transconductance amplifier 101 receives the voltage $V_{Ri}$, transconductance amplifier 102 receives the voltage $V_{Ri+j}$, and transconductance amplifier 103 receives the voltage $V_{Ri+2j}$. In this embodiment, the voltage $V_{Ri+j}$ is incrementally larger than the voltage $V_{Ri}$, and the voltage $V_{Ri+2j}$ is incrementally larger than the voltage $V_{Ri+j}$. Thus, for an $N_F$ number of folds each successive voltage $V_{Ri+2j}$ would be incrementally larger than the preceding voltage $V_{Ri+j}$.

The combined differential outputs of transconductance amplifiers 101–103 are connected to pre-amplifier load 120. Pre-amplifier load 120 is typically a resistive type load that provides a current to voltage conversion, thus producing differential voltages $V_{OUTP}$ and $V_{OUTM}$. Outputs $V_{OUTP}$ and $V_{OUTM}$ are connected to a next stage load, which may be another pre-amplifier folding stage, a comparator stage or other type of electronic load. With pre-amplifier load 120 connected to comparators, a binary output signal is generated having a value dependent upon the folded signals position corresponding to the value of the input signal with respect to a Zero Crossing (Z/C).

The concept of the zero crossing is discussed in greater detail below. However, at this point suffice it to note, that if the value of the input signal corresponds to a position of the folded signal that is above the zero crossing, then the comparator generates an output signal having a first binary state. On the other hand, if the value of the input signal corresponds to a position of the folded signal that is below the zero crossing, then the comparator generates an output signal having a second binary state.

Note that the connection of the differential outputs of transconductance amplifier 102 to the pre-amplifier load 120 is opposite from the connection of the differential outputs of transconductance amplifiers 101 and 103. These connections are particularly relevant to forming the transfer function of the folded signal.

Figure 1B:
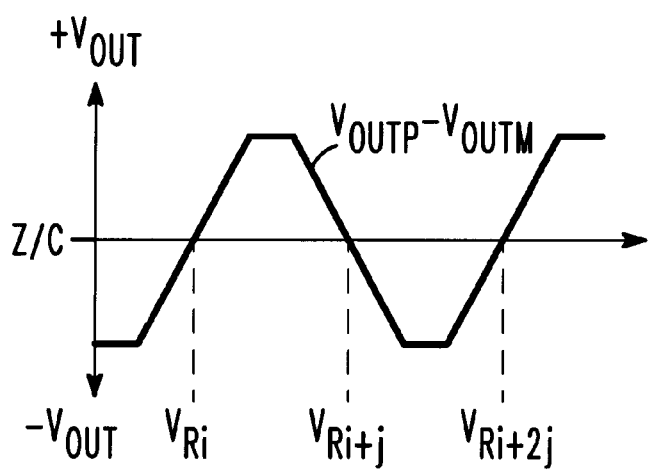
FIG. 1B is a transfer function from the circuit of FIG. 1A.

The transfer function illustrated in FIG. 1B shows the differential voltages $V_{OUTP}$ and $V_{OUTM}$ that form a folded signal with respect to input voltage $V_{IN}$. The transfer function is illustrated having three folds that correspond to the three transconductance amplifiers 101, 102, and 103. Transconductance amplifiers 101 and 103 generate the positive sloping portions of the transfer function, while transconductance amplifier 102 generates the negative sloping portion of the transfer function. The zero crossings occur when the voltage $V_{IN}$ is equal to the various reference voltages, $V_{Ri}$, $V_{Ri+j}$, and $V_{Ri+2j}$. Duplicating the pre-amplifier circuitry and varying the magnitude of the reference voltages at the inputs to the transconductance amplifiers creates a family of folded signals.

FIG. 2 illustrates a family of 24 folded signals labeled F1_1 through F1_24. Each of the folded signals is folded three times. The positive slope portions of the signals F1_1 through F1_24 is shown in the sections at the right and at the left of the transfer function. Only the negative slope portions of the signals F1_1, F1_12 and F1_24 are shown for purposes of clarity. However, the negative slope portions exist for all of the folded signals F1_1 through F1_24.

There are three separate zero crossings for each of the folded signals. The zero crossing is the midpoint in the amplitude of the output signal of the transconductance amplifier that corresponds to the trip point for the comparators. That is, when the folded signal crosses the trip point, the comparator switches binary states.

Near the zero crossing for a particular folded signal the values of the adjacent folded signals lying above and below the zero crossing are averaged to compensate for errors of non-linearity such as DNL and INL. For example, corresponding to input signal range tap 8, the folded signals within the ellipse are averaged. Because there is a complete set of folded signals above and below the zero crossing, the resulting average serves to enhance the fidelity of the device.

However, at the extremes of the input signal range, e.g. near input signal range taps 0–4 and 60–64, the complete set of folded signals above and below the Z/C is not available for averaging. In the tap range of 0–4, there is a partial absence of folded signals above the zero crossing. Similarly, in the tap range of 60–64, there is a partial absence of folded signals below the zero crossing. Thus, averaging an incomplete set of folded signals at the extremes of the input signal range skews the desired result, increasing the DNL and INL errors.

FIG. 3 illustrates a non-optimal approach that provides a solution to the average skewing at the extremes of the input signal range. In this solution, an extra fold is added to each of the folded signals. Thus, folded signals F1_1, . . . , F1_24 are each folded four times. By folding the signals four times, there is a complete set of folded signals above and below the zero crossings at the lower and upper extremes of the input signal range.

However, this approach requires an additional transconductance amplifier for each of the folded signals and in the example illustrated, 24 additional transconductance amplifiers would be required. This approach adds components that have a marginal use, i.e., they are only required at the extremes of the input signal range. Further, the additional folds are not necessary in the central portion of the input signal range. Therefore, the approach that adds an additional fold results in increased cost and complexity to the device.

FIG. 4 illustrates one technique of the present invention in terms of the folded transfer function. In this approach only the folded signals necessary for averaging at the lower and upper extremes of the input signal range are folded an additional time. Accordingly, the folded signals that are used for averaging in the central portion of the input signal range do not have the additional fold. By way of example, folded signals F1_1 to F1_5 at the upper extreme and folded signals F1_21 to F1_24 at the lower extreme of the input signal range are folded four times. However, the remaining signals F1_6 to F1_20 that cover the central portion of the input signal range are folded only three times.

FIG. 5 shows the folds added for signals F1_1 to F1_5 and F1_21 to F1_24, (shown in reverse polarity by dashed lines) to illustrate the complete set of folded signals for averaging at the extremes of the input signal range. By providing the additional folds for the selected signals at the extremes of the input signal range, i.e., the 0 tap and the 64 tap, a complete set of folded signals is available for averaging. The advantage of this approach over other approaches is that only nine additional transconductance amplifiers are needed, compared to the 24 additional transconductance amplifiers needed when every signal is folded an additional time.

Figure 6:
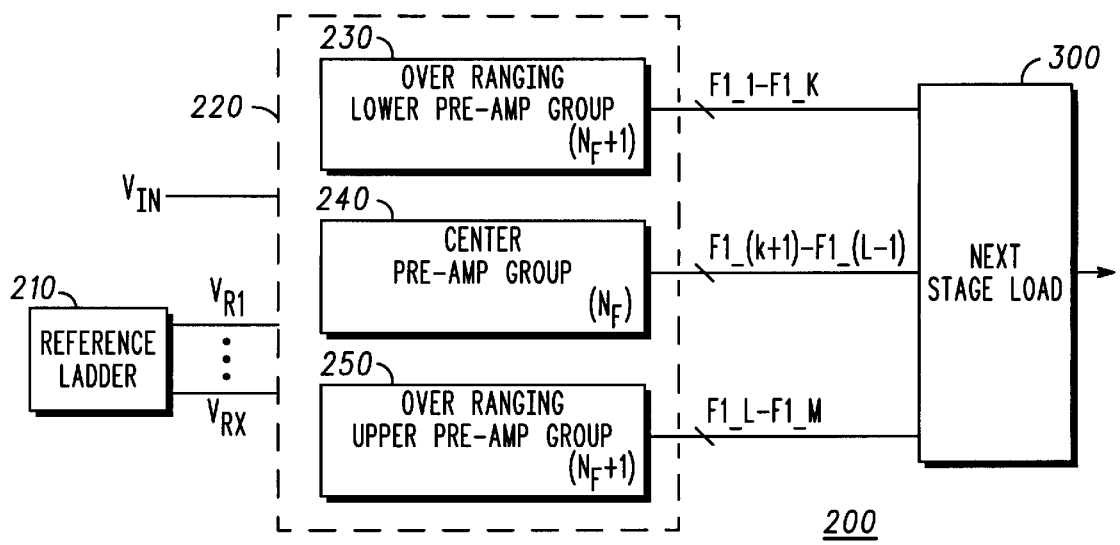
FIG. 6 is a block diagram of one embodiment of the present invention.

FIG. 6 illustrates a selective over ranging circuit 200 having a selective over-ranging pre-amplifier stage 220. Pre-amplifier stage 220 includes an over-ranging lower pre-amplifier group 230, a center pre-amplifier group 240, and an over-ranging upper pre-amplifier group 250. The selective over-ranging pre-amplifier stage 220 is connected to a resistor ladder 210 and coupled for receiving an input voltage $V_{IN}$. The resistor ladder 210 provides reference voltages ranging from a value $V_R^1$ to a value $V_R^x$, where X is the number of taps that corresponds to the desired resolution.

The output of the selective over-ranging pre-amplifier stage 220 is a family of folded signals F1_1 to F1_M that is shown as three groups in FIG. 6. The first group includes signals F1_1 to F1_K, the second group includes signals F1_(K+1) to F1_(L-1), and the third group includes signals F1_L to F1_M, where F1 indicates first stage folding. The family of folded signals is connected to a next stage load 300. Additional folding stages are possible depending on the application.

Transconductance amplifiers 101, 102, and 103 (see FIG. 1) produce a folded signal from $V_{IN}$ and their associated reference voltages. Center pre-amplifier group 240 produces a family of folded signals for the central portion of the input signal range where there is adequate coverage for averaging above and below the zero crossing. Transconductance amplifiers 101, 102, and 103 produce the folded signals in the central portion, i.e., F1_6 to F1_20, for the three fold embodiment described above. In general terms, this is expressed as F1_(K+1) to F1_(L-1), where F1_(K+1) is the lower limit of the family of folded signals in the central portion of the input signal range and F1_(L-1) is the upper limit of the family of folded signals in the central portion of the input signal range.

However, at the extremes of the input signal range, additional folds are needed to provide adequate coverage above and below the zero crossings. The over-ranging lower pre-amplifier group 230 provides an additional fold as compared to the folded signals of the center pre-amplifier group 240, i.e., four folds for the folded signals F1_1 to F1_5 (corresponding to the example discussed above, i.e., a family of 24 three times folded signals). Note from FIGS. 4 and 5 that although an additional fold is generated for the lower group of the family of folded signals, i.e., F1_1 to F1_5, the additional fold is applied to averaging at the upper extreme of the input signal range. In general terms, an additional fold is generated for folded signals F1_1 to F1_K, where F1_1 to F1_K defines a lower group of the family of folded signals and the additional fold generated is applied to averaging at the upper extreme of the input signal range.

The over-ranging upper pre-amplifier group 250 provides an additional fold as compared to the folded signals of the center pre-amplifier group 240, i.e., four folds for those folded signals F1__20 to F1__24, (again corresponding to the example discussed above, i.e., a family of 24 three times folded signals). Note from FIGS. 4 and 5, that although an additional fold is generated for the upper group of the family of folded signals, i.e., F1__20 to F1__24, the additional fold is applied to averaging at the lower extreme of the input signal range. In general terms, an additional fold is generated for folded signals F1__L to F1__M. Where F1__L to F1__M defines an upper group of the family of folded signals and the additional fold generated is applied to averaging at the lower extreme of the input signal range.

Thus, over-ranging lower pre-amplifier group 230 is comprised of a plurality of pre-amplifier circuits with each pre-amplifier circuit including a number of transconductance amplifiers. Similarly, over-ranging upper pre-amplifier group 250 includes pre-amplifier circuits, i.e., transconductance amplifiers. Each pre-amplifier circuit produces a folded signal.

The number of folded signals produced by the over-ranging lower pre-amplifier group 230 need not be equal to the number of folded signals produced by the over-ranging upper pre-amplifier group 250. Thus, the number of pre-amplifier circuits in the over-ranging lower and upper pre-amplifier groups 230 and 250 need not be equal.

Generally, the pre-amplifier circuits comprising the over-ranging lower pre-amplifier group 230 and the over-ranging upper pre-amplifier group 250 contain an additional transconductance amplifier ($N_A+1$ transconductance amplifiers) as compared to the pre-amplifier circuits comprising the center pre-amplifier group 240 ($N_A$ transconductance amplifiers). Therefore, a three times folded signal is produced by a pre-amplifier circuit having three transconductance amplifiers ($N_F=N_A=3$). A four times folded signal is produced by a pre-amplifier circuit having four transconductance amplifiers ($N_F+1=N_A+1=4$), as discussed next. However, the actual number of folds is dependent on the application and three and four folds are given for exemplary purposes only.

Figure 7A:
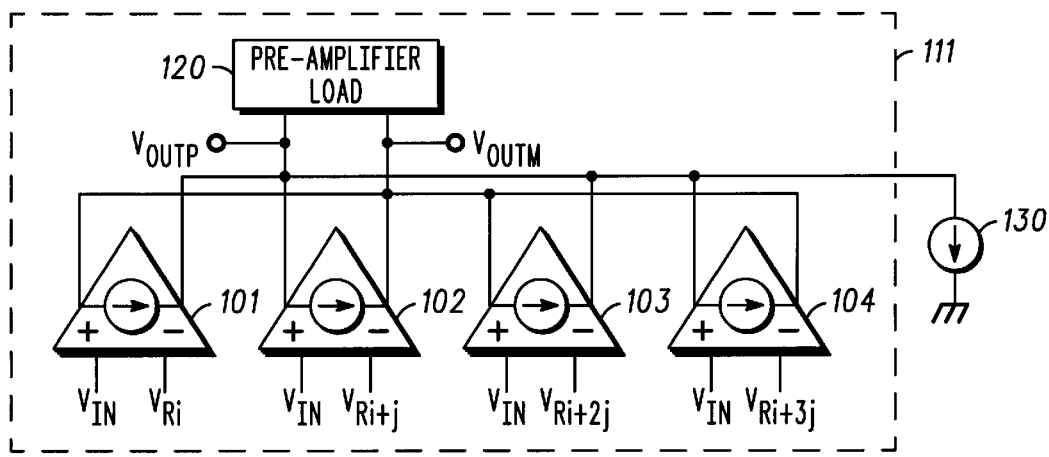
FIG. 7A is a partial circuit diagram of an over-ranged folded pre-amplifier.

FIG. 7A illustrates a pre-amplifier circuit 111 for an over-ranging folded signal of the type produced by the over-ranging lower pre-amplifier group 230 or the over-ranging upper pre-amplifier group 250 (see FIG. 6). In the example illustrated, a four times folded signal is produced by pre-amplifier circuit 111, which includes transconductance amplifiers 101, 102, 103, and 104.

One input of each of the plurality of transconductance amplifiers 101–104 is typically coupled for receiving the input signal $V_{IN}$. Another input of the transconductance amplifiers 101–104 is connected to a resistor ladder 210 (FIG. 6) and receives the reference voltage $V_R$. For example, transconductance amplifier 101 receives the voltage $V_{R^i}$, transconductance amplifier 102 receives the voltage $V_{R^{i+j}}$, transconductance amplifier 103 receives the voltage $V_{R^{i+2j}}$, and transconductance amplifier 104 receives the voltage $V_{R^{i+3j}}$. The voltage $V_{R^{i+3j}}$ is incrementally larger than the voltage $V_{R^{i+2j}}$, which in turn is incrementally larger than the voltage $V_{R^{i+j}}$, which is incrementally larger than the voltage $V_{R^i}$. Thus, for a number of folds $N_F$, each successive voltage $V_{R^{i+2j}}$ is incrementally larger than the preceding voltage $V_{Ri+j}$.

A dummy current source 130 is provided in the case of an even number of folds to generate a transfer function that begins in a positive or negative state, i.e., at $\mp V_{OUT}$. In the case of an odd number of folds, the dummy current source 130 is not required.

In FIG. 7 a transfer function is desired that starts in a negative state and initially goes positive. One could achieve the opposite wave form by reversing the connections of the transconductance amplifiers 101, 102, 103, and 104 and connecting current source 130 to $V_{OUTM}$. The combined differential outputs of the plurality of transconductance amplifiers 101–104 are connected to a pre-amplifier load 120, i.e., a resistive load converting a current to a voltage. Differential output voltages $V_{OUTP}$ and $V_{OUTM}$ are coupled to a next stage (not shown), which may be another pre-amplifier folding stage, a comparator stage, or other type of electronic load.

Figure 7B:
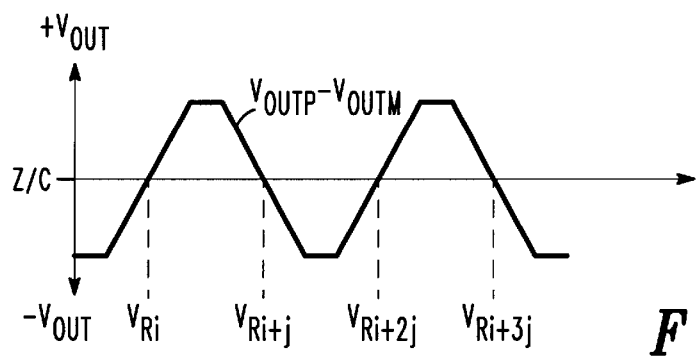
FIG. 7B is a transfer function from the circuit of FIG. 7A.

FIG. 7B illustrates the transfer function that generates the differential output voltages $V_{OUTP}$ and $V_{OUTM}$ that form a folded signal with respect to the input voltage $V_{IN}$. Note that the transfer function illustrated has four folds corresponding to the four transconductance amplifiers 101–104. Transconductance amplifiers 101 and 103 generate the positive sloping portions of the transfer function while transconductance amplifiers 102 and 104 generate the negative sloping portions of the transfer function. The zero crossings occur when the voltage $V_{IN}$ is equal to the various reference voltages $V_{R^{i+j}}$, $V_{R^{i+1j}}$, $V_{R^{i+2j}}$, and $V_{R^{i+3j}}$. Duplicating the pre-amplifier circuitry and varying the magnitude of the reference voltage inputs to the transconductance amplifiers creates additional over-ranging folded signals.

By now it should be appreciated that a cost effective solution to the problem of averaging differential and integral non-linearity at the upper and lower extremes of the input signal range has been shown.

What is claimed is:

1. A circuit for selective over-ranging in folding and averaging input signals, comprising a selective over-ranging pre-amplifier stage coupled for receiving an analog input signal and a plurality of reference voltages and producing a plurality of folded signals, wherein a first group of the plurality of the folded signals are folded $N_F$ times and a second group of the plurality of folded signals are folded $N_F+1$ times.

2. The circuit of claim 1, wherein a third group of the plurality of folded signals are folded $N_F+1$ times.

3. The circuit of claim 2, further comprising a next stage load coupled to the selective over-ranging pre-amplifier stage and receiving the plurality of folded signals.

4. The circuit of claim 2, wherein the selective over-ranging pre-amplifier stage comprises:
   a center pre-amplifier group for producing the first group of the plurality of folded signals;
   an over-ranging lower pre-amplifier group for producing the second group of the plurality of folded signals; and
   an over-ranging upper pre-amplifier group for producing the third group of the plurality of folded signals.

5. The circuit of claim 4, wherein the center pre-amplifier group is comprised of a plurality of pre-amplifier circuits.

6. The circuit of claim 5, wherein the over-ranging lower pre-amplifier group is comprised of a second plurality of pre-amplifier circuits.

7. The circuit of claim 6, wherein the over-ranging upper pre-amplifier group is comprised of a third plurality of pre-amplifier circuits.

8. The circuit of claim 7, wherein each of the first plurality of pre-amplifier circuits is comprised of $N_A$ number of transconductance amplifiers.

9. The circuit of claim 8, wherein each of the second plurality of pre-amplifier circuits is comprised of $N_A+1$ number of transconductance amplifiers.

10. The circuit of claim 8, wherein each of the third plurality of pre-amplifier circuits is comprised of $N_A+1$ number of transconductance amplifiers.

11. A method for folding and averaging input signals comprising:

providing an input signal within an input signal range;

providing a plurality of reference voltages;

coupling the input signal and the plurality of reference voltages to a selective over-ranging pre-amplifier stage to produce a plurality of folded signals;

producing a first group of the plurality of folded signals wherein each of the first group of the plurality of folded signals is folded $N_F$ times; and producing a second group of the plurality of folded signals wherein each of the second group of the plurality of folded signals is folded $N_F+1$ times.

12. The method of claim 11, further comprising the step of producing a third group of the plurality of folded signals wherein each of the third group of the plurality of folded signals is folded $N_F+1$ times.

13. The method of claim 12, further comprising coupling the first, second and third groups of the plurality of folded signals to a next stage load.

14. The method of claim 12, further comprising:

providing a zero crossing for each fold of the third group of the plurality of folded signals; and averaging each of the third group of the plurality of folded signals near the zero crossing within the input signal range.

15. The method of claim 11, further comprising:

providing a zero crossing for each fold of the first group of the plurality of folded signals; and averaging each of the first group of the plurality of folded signals near the zero crossing within the input signal range.

16. The method of claim 11, further comprising:

providing a zero crossing for each fold of the second group of the plurality of folded signals; and averaging each of the second group of the plurality of folded signals near the zero crossing within the input signal range.

17. A method for folding and averaging input signals, that includes producing a plurality of folded signals from an input signal within an input signal range and a plurality of reference voltages, wherein a first group of the plurality of folded signals is folded $N_F$ times and a second group of the plurality of folded signals is folded $N_F+1$ times.

18. The method of claim 17 wherein a third group of the plurality of folded signals is folded $N_F+1$ times.

19. The method of claim 18 further comprising the step of producing the third group of the plurality of folded signals wherein at least one fold is produced from an extreme portion of the input signal range.

20. The method of claim 17 further comprising the step of producing the first group of the plurality of folded signals wherein at least one fold is produced from a center portion of the input signal range.

21. The method of claim 17 further comprising the step of producing the second group of the plurality of folded signals wherein at least one fold is produced from an extreme portion of the input signal range.

* * * * *